United States Patent
Oshetski et al.

(10) Patent No.: US 10,401,169 B2
(45) Date of Patent: Sep. 3, 2019

(54) ENHANCED POWER TRANSMISSION TOWER CONDITION MONITORING SYSTEM FOR OVERHEAD POWER SYSTEMS

(71) Applicant: Micatu Inc., Horseheads, NY (US)

(72) Inventors: Michael Oshetski, Horseheads, NY (US); Atul Pradhan, Pittsford, NY (US)

(73) Assignee: Micatu Inc., Horseheads, NY (US)

( * ) Notice: Subject to any disclaimer, the term of this patent is extended or adjusted under 35 U.S.C. 154(b) by 194 days.

(21) Appl. No.: 15/290,767

(22) Filed: Oct. 11, 2016

(65) Prior Publication Data

US 2017/0102234 A1 Apr. 13, 2017

Related U.S. Application Data

(60) Provisional application No. 62/239,540, filed on Oct. 9, 2015.

(51) Int. Cl.
G01R 31/00 (2006.01)
G01C 9/06 (2006.01)
G01R 31/08 (2006.01)

(52) U.S. Cl.
CPC .............. *G01C 9/06* (2013.01); *G01R 31/085* (2013.01); *G01R 31/088* (2013.01)

(58) Field of Classification Search
USPC ................... 324/537, 508–510, 713, 764.01; 340/870.06, 870.07
See application file for complete search history.

(56) References Cited

U.S. PATENT DOCUMENTS 3,567,325 A  3/1971  Tibbals, Jr.
3,742,222 A  6/1973  Endl
(Continued)

FOREIGN PATENT DOCUMENTS

CN  104283321 A  1/2015
CN  104345233 A  2/2015
(Continued)

OTHER PUBLICATIONS

PCT International Search Report and Written Opinion corresponding to PCT/US2016/027782, dated Jul. 12, 2016.
(Continued)

*Primary Examiner* — Vincent Q Nguyen
(74) *Attorney, Agent, or Firm* — Pepper Hamilton LLP

(57) ABSTRACT

A power transmission tower condition monitoring system includes a plurality of sensors configured to be positioned at a plurality of separate locations on the power transmission tower. The plurality of sensors includes at least one tilt sensor, at least one shock sensor, and at least one vibration sensor. One or more detectors are configured to receive intensity value data from the plurality of sensors. A computing device is coupled to the one or more detectors and includes a processor and a memory coupled to the processor. The processor executes programmed instructions stored in the memory to receive the intensity value data from the one or more detectors. A current operational health for the power transmission tower is determined based on the received intensity value data. A method for monitoring a condition of a power transmission tower using the power transmission tower condition monitoring system is also disclosed.

20 Claims, 7 Drawing Sheets

(56) References Cited

U.S. PATENT DOCUMENTS

| | | | |
|---|---|---|---|
| 3,824,018 | A | 7/1974 | Crane, Jr. |
| 5,396,172 | A | 3/1995 | Lat et al. |
| 5,896,193 | A | 4/1999 | Colbourne et al. |
| 5,903,158 | A | 5/1999 | Eriksson et al. |
| 7,136,169 | B2 | 11/2006 | Sandstrom |
| 2009/0323737 | A1 | 12/2009 | Ensher et al. |
| 2011/0317235 | A1 | 11/2011 | Desai |
| 2012/0031581 | A1 | 2/2012 | Chillar et al. |
| 2012/0050735 | A1 | 3/2012 | Higgins et al. |
| 2012/0092114 | A1 | 4/2012 | Matthews |
| 2012/0315002 | A1 | 12/2012 | Wigley et al. |
| 2014/0118003 | A1 | 5/2014 | Chen et al. |
| 2014/0145858 | A1* | 5/2014 | Miller ............ G08C 17/02 340/870.07 |
| 2015/0311987 | A1* | 10/2015 | Meyer ............ H04B 1/03 340/657 |

FOREIGN PATENT DOCUMENTS

| | | |
|---|---|---|
| DE | 102007013466 A1 | 10/2008 |
| DE | 102012109640 A1 | 4/2014 |
| EP | 1786083 A1 | 5/2007 |
| WO | 2012/031447 A1 | 3/2012 |
| WO | 2014014783 A1 | 1/2014 |
| WO | 2015178975 A2 | 11/2015 |

OTHER PUBLICATIONS

International Search Report and Written Opinion for corresponding PCT Application No. PCT/US2015/015763 (dated Nov. 13, 2015).

EP Search Report for EP Application No. 15795374.6, dated Sep. 26, 2017.

Zook et al., "Fiber-Optic Vibration Sensor Based on Frequency Modulation of Light-Excited Oscillators", Sensors and Actuators 83 (2000), pp. 270-276.

Oursler et al., "Full-Field Vibrometry Using a Fabry-Perot Etalon Interferometer" Applied Optics, vol. 31, No. 34, (1992), pp. 7301-7308.

Furstenau et al., "Fiber-Optic Extrinsic Fabry-Perot Interferometer Vibration Sensor with Two-Wavelength Passive Quadrature Readout", IEE Transactions on Instrumentation and Measurement, IEE Service Center, vol. 47, No. 1 (1998), pp. 143-147.

EP Search Report for EP Application No. 16780848.4, dated Nov. 29, 2018.

* cited by examiner

ENHANCED POWER TRANSMISSION TOWER CONDITION MONITORING SYSTEM FOR OVERHEAD POWER SYSTEMS

This application claims the benefit of U.S. Provisional Patent Application Ser. No. 62/239,540, filed Oct. 9, 2015, which is hereby incorporated by reference in its entirety.

FIELD

The subject matter described herein generally relates to power transmission tower monitoring device and, more particularly, to a method and condition monitoring system for facilitating operation of a power transmission tower monitoring device.

BACKGROUND

The modern power grid distribution architecture requires the significant use of power cables and power equipment that is mounted to aerial mechanical supporting structures. When electrical transmission cables and equipment are mounted on towers or wooden poles in outdoor environments they are vulnerable to both natural and man-made damage, such as wind, snow, ice, flooding, earthquake, vehicle collisions, or other sources of potential destruction. Such an event to a power transmission tower could cause serious damage, such as shock of an impact or tilting of the mounted electrical transmission tower, resulting in loss of electrical service, fire, equipment failure, or even great harm to both people and society.

The traditional method of monitoring power transmission tower operational status is limited to detection of tilt sensor information only. A wireless signal is sent to a communication center once a pre-determined angle is recorded from the tilt sensor mounted at the base on the power transmission tower. The current state of the art presents a serious lack in capability to detect damage to a power transmission tower as a result of an impact or shock resulting in damage to the pole, but no change to the angle of pole. Additionally, a wooden pole used for a power transmission tower may fracture mid-way, or at the top, resulting in the lower portion of the pole being vertical, while the upper portion is horizontal or at some non-vertical angle, which is unlikely to be detected by current state of the art power transmission tower monitoring equipment. Furthermore, a wooden power transmission tower may fracture during a storm, resulting in a latent failure condition of the power transmission tower, cable, or equipment. The latent failure condition could be determined via vibrational signals transmitted through the supporting power transmission tower structure.

The present invention is directed to overcoming these and other deficiencies in the art.

SUMMARY

One aspect of the present invention relates to a power transmission tower condition monitoring system. The power transmission tower condition monitoring system includes a plurality of sensors configured to be positioned at a plurality of separate locations on the power transmission tower. The plurality of sensors includes at least one tilt sensor, at least one shock sensor, and at least one vibration sensor. One or more detectors are configured to receive intensity value data from the plurality of sensors. A computing device is coupled to the one or more detectors and includes a processor and a memory coupled to the processor. The processor executes programmed instructions stored in the memory to receive the intensity value data from the one or more detectors. A current operational health for the power transmission tower is determined based on the received intensity value data.

Another further aspect of the present invention relates to a method for monitoring a condition of a power transmission tower. The method includes providing a power transmission tower condition monitoring system according to the present invention. The plurality of sensors are coupled to the power transmission tower. The intensity value data is measured for each of the plurality of sensors over a period of time. A current operational health for the power transmission tower is determined based on the intensity value data for each of the plurality of optical sensors.

A further aspect of the present invention relates to a power transmission tower condition monitoring system including a light source configured to produce an emitted light beam. A plurality of optical sensors are configured to be positioned at a plurality of separate locations on a power transmission tower and to receive the emitted light beam from the light source. Each of the plurality of optical sensors is configured to generate one or more product light beams from the emitted light beam. The plurality of optical sensors includes at least one tilt sensor, at least one shock sensor, and at least one vibration sensor. A detector is positioned to receive the one or more product light beams generated from each of the plurality of optical sensors and is configured to measure intensity values of the one or more product light beams for each of the plurality of optical sensors. A computing device is coupled to the detector and includes a processor and a memory coupled to the processor. The processor executes programmed instructions stored in the memory to determine, based on the measured intensity values for the one or more product light beams for each of the plurality of optical sensors, at least an angular displacement value, a rotation value, a tilt value, or an incline value for the power transmission tower.

Yet another aspect of the present invention relates to a method for monitoring a condition of a power transmission tower. The method includes providing a power transmission tower condition monitoring system according to the present invention. The plurality of optical sensors are coupled to the power transmission tower. The intensity values for the one or more product light beams are measured for each of the plurality of optical sensors over a period of time. At least an angular displacement value, a rotation value, a tilt value, or an incline value for the power transmission tower are determined based on the measured intensity values for the one or more product light beams for each of the plurality of optical sensors over the period of time. The determined angular displacement value, the rotation value, the tilt value, and the incline value are monitored for changes over the period of time to monitor the condition of the power transmission tower.

The devices and methods of the present invention provide an on-line monitoring system for simultaneous condition monitoring of power transmission tower tilt, shock, and/or vibration, in real-time with continuous recording of the various effects of environmental or man-made damage and early discovery of latent failures of tower, to achieve basic reliability and maintenance. Furthermore, the present invention provides real-time monitoring of shock and vibration levels, in addition to the tilt of the power transmission tower. As a result, the present invention provides a preventive role

DETAILED DESCRIPTION

Figure 1:
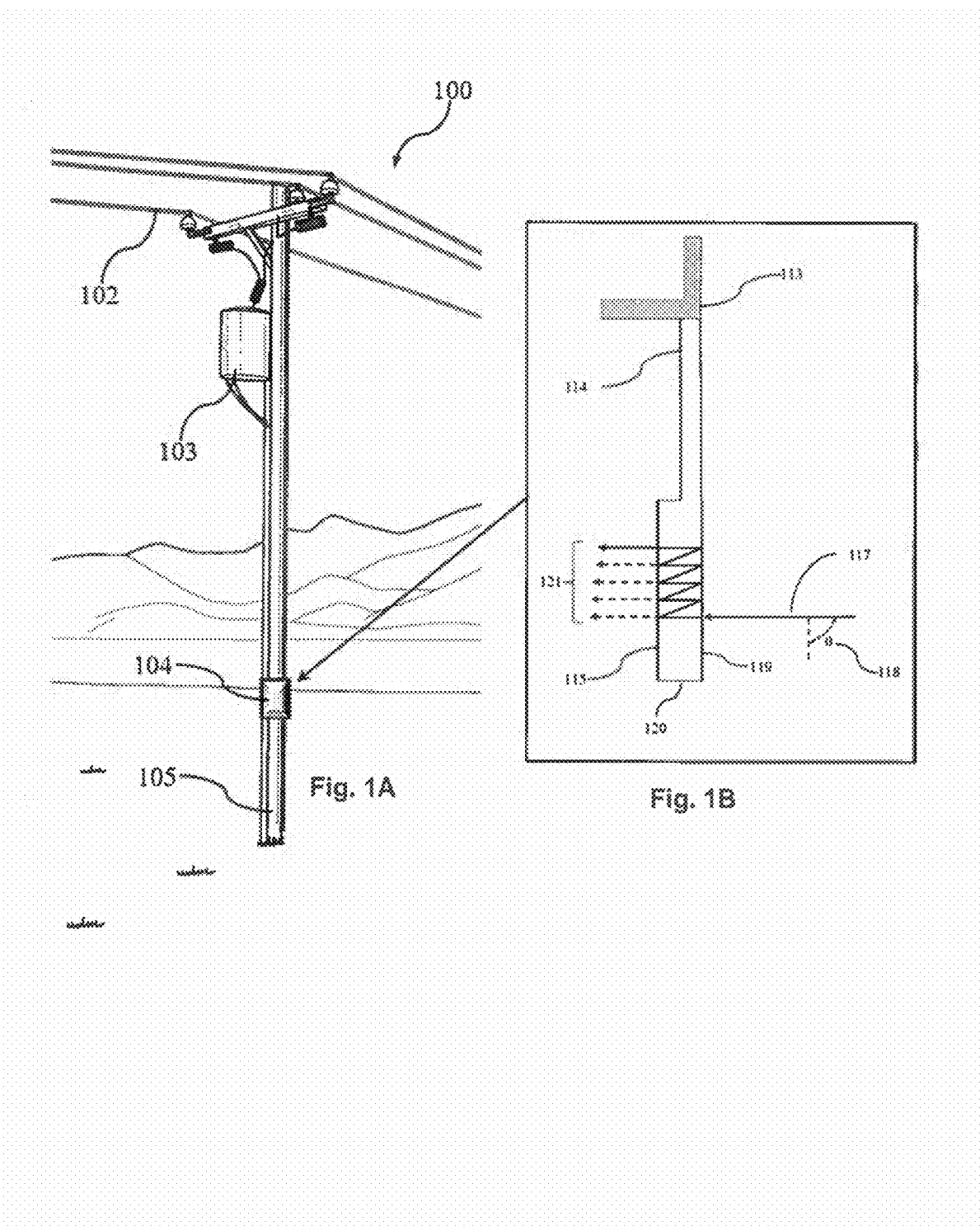
FIG. 1A is a perspective view of an environment including an exemplary power transmission tower monitoring system according to an embodiment of the present invention located on a power transmission tower in a non-fault state.
FIG. 1B is a design view of a sensor having an optical element coupled to a cantilever for use in the exemplary power transmission monitoring system of the present invention while the power transmission tower is in the non-fault state.

The present invention relates to a sensor system and methods of use thereof.

More specifically, the present invention relates to an optical sensor or electrical sensor, or combination thereof embodied into a system for condition monitoring, a method of measuring angular displacement, a method of measuring angular velocity, a method of measuring magnitude, and/or a method of measuring vibrational frequency of a power transmission tower using said system, and a method of monitoring the condition of an power transmission tower using said system. For the purposes of the present invention, a power transmission tower is defined as any mechanical structure that supports power transmission cables above the ground, which includes both wooden poles and metal tower structures.

One aspect of the present invention relates to a power transmission tower condition monitoring system. The power transmission tower condition monitoring system includes a plurality of sensors configured to be positioned at a plurality of separate locations on the power transmission tower. The plurality of sensors includes at least one tilt sensor, at least one shock sensor, and at least one vibration sensor. One or more detectors are configured to receive intensity value data from the plurality of sensors. A computing device is coupled to the one or more detectors and includes a processor and a memory coupled to the processor. The processor executes programmed instructions stored in the memory to receive the intensity value data from the one or more detectors. A current operational health for the power transmission tower is determined based on the received intensity value data.

FIG. 1A is a perspective view of a power transmission tower 100 including a power transmission tower monitoring system 104 according to an example of the present invention, with the power transmission tower in a non-fault operational state. As illustrated in FIG. 1A, the power transmission tower 100 includes a variety of components that may be monitored as part of the present technology.

More specifically, the power transmission tower 100 in a non-fault condition includes power transmission cables 102, a voltage transformer 103, the power transmission tower monitoring system 104, and a power transmission tower base 105. In the operational non-fault state, the power transmission tower 100 is in a vertical position relative to the ground or supporting structure connected to the power transmission tower base 105. Electrical power is transmitted via power transmission cables 102 which are sequentially supported by additional power transmission towers (not shown) that comprise a power distribution cable for the distribution of power from the power generation source. Power is stepped down from high voltage to low voltage via the step-down voltage transformer 103 for sub-distribution above ground or underground to additional power transmission towers. For purposes of clarity, normal tilt or sway of the power transmission tower 100 from vertical, which results from environmental conditions such as wind, earthquake, snow, ice, flooding, etc., are not illustrated in FIG. 1A. Further, for the purpose of the present invention, normal tilt or sway is defined as changes to the perpendicular orientation of the power transmission tower 100 that do not affect the operational capability of the power transmission tower 100 or the ability to support the power transmission cables 102 as intended and for which the power transmission tower 100 returns back to a perpendicular orientation after the environmental conditions have subsided.

FIG. 1B illustrates an embodiment of the power transmission monitoring system 104 when the power transmission tower 100 is in the operational state shown in FIG. 1A. In this example, the power transmission monitoring system 104 is a static displacement optical sensor, such as described in PCT Application PCT/US2015/15763, the disclosure of which is incorporated herein by reference in its entirety, although other types and/or numbers of sensors may be utilized. By way of example, a plurality of sensors could be utilized. Sensors included in the said optical condition monitoring system include those for: angular displacement, angular velocity, magnitude, and vibrational frequency. The exemplary technology combines the optical sensor technologies into a complete system and method of measuring vibration, a system and method of measuring shock, a system and method of measuring tilt of a power transmission tower using the system, and a system and method of monitoring the condition of a power transmission tower.

In another example, microelectromechanical sensors (MEMS) configured to measure intensity values for the plurality of product electrical signals are utilized. A computing device is coupled to the detectors. The computing device includes a processor and a memory coupled to the processor so that the processor executes programmed instructions stored in the memory to determine, based on the measured intensity values, a change in electrical signal proportional to the sensor measurement.

A static displacement optical sensor in one example comprises a light source, an optical element, such as an etalon, mounted on a cantilever, and the aforementioned detector. The optical element clear aperture is positioned such that it is perpendicular to the optical beam from the light source. The cantilever to which the optical element is mounted is positioned vertically parallel to the direction of the power transmission tower or pole. As the power transmission tower or pole undergoes a tilt or an incline, a significant component of gravitational force will be applied perpendicular to the cantilever so that the cantilever will rotate and undergo an angular displacement with respect to the initial direction of the optical beam such that the angular position of the cantilever will no longer be perpendicular to the optical beam.

For an end mass cantilever, the cantilever deflection angle ($\theta_C$) is related to the angle of tilt of the power transmission tower or pole ($\theta_T$) as:

$$\theta_C = Mg \sin \theta_T L^2 / Ewt^3 \quad [1]$$

Where M is the mass of the end mass cantilever, g is the acceleration due to gravity, L is the length of the cantilever, E is Young's Modulus of the cantilever material, w is the width of the cantilever, and t is the thickness of the cantilever. As the transmission tower or pole undergoes tilt or incline by angle ($\theta_T$), the cantilever undergoes a positional deflection in angle ($\theta_C$). The angular position or displacement or rotation of the cantilever ($\theta_C$) can then be measured as with the optical sensor as described in PCT Application PCT/US15/15763 advantageously, as the optical intensity measured with such sensor is causally a direct function of ($\theta_C$) by way of equation [1]. Acceleration and vibration of the transmission tower or pole can therefore also be directly measured using time second derivatives of the of ($\theta_T$) and ($\theta_C$) in equation [1].

An advantage of the aforementioned embodiment using a static displacement optical sensor as described in PCT Application PCT/US2015/15763 is the that the tilt or incline of the power transmission tower or pole is calculated directly from the analog optical sensor measurement, which does not require complex signal processing and conditioning requiring dedicated specialized circuitry. Such circuitry necessitates the use of scale and offset factors in the electrical signal to tilt or incline angle determination that are calibration dependent. Such scale or offset factors can vary and lead to inaccuracies due to electrical variations in the signal processing and conditioning circuitry.

In this example, the optical sensor includes a cantilever 114 attached to a base 113 at a cantilever pivot point and an optical element 112. The exit surface 115 of the optical element 112 has a plurality of beams generated by multiple reflections within the optical element 112 between the exit surface 115 and an entrance surface 119 or Clear Aperture (CA) and originating from an incoming optical beam 117. The incoming optical beam 117 forms an angle 118 within the optical element cavity 120 respect to the initial orientation of the cantilever 114 for the case where the power transmission tower 100 or pole is not tilted or inclined and is at or close to a vertical position aligned with the direction of gravity. An output plurality of optical beams 121 have a measureable intensity unique to the initial tilt or incline angular position, displacement, or rotation of the power transmission tower 100 or pole.

FIG. 2A is a perspective view of a power transmission tower 200 in a tilt-fault operational state. In this example, the power transmission tower 200 in a tilt-fault operational condition includes power transmission cables 202, a voltage transformer 203, a power transmission tower monitoring system 204, and a power transmission tower base 205. As illustrated in FIG. 2A, the power transmission tower 200 is in a non-perpendicular orientation relative to the support base 205. The change of the operational state between the power transmission tower 100 from FIG. 1A to the power transmission tower 200 in FIG. 2A is, by way of example, the result of an environmental event or non-environmental event that resulted in a permanent non-vertical state in which power transmission tower will not return to the vertical operational state as illustrated in FIG. 1A. Further, for the purpose of clarity, resulting damage to the voltage transformer 203, support structure 205, or voltage transmission cables 202 is not depicted. The power transmission tower 200 may or may not still be in an operational state that would result in the loss of power distribution. The monitoring system 204 is mounted at the base of 205 to alert to changes of tilt operational state of the power transmission tower 200. More specifically, the present invention allows for the rapid identification of when power transmission tower 200 may be operational for power distribution, however, is in a non-perpendicular orientation and pending a power distribution failure.

FIG. 2B illustrates the power transmission monitoring system 204 when the power transmission tower 200 is in the tilt-fault state shown in FIG. 2A. The cantilever 216 is attached to a base 213 at a cantilever pivot point and incorporates an optical element Clear Aperture (CA) 214 (entrance surface of optical beam). The displacement angle 215 of the cantilever 216 is due to tilt or incline of the power transmission tower 200 or pole since the force due to gravity will act to displace the cantilever 216 with optical element 214. The direction of the optical beam 217 on the optical element 214 will change with respect to the initial optical beam direction 218. The initial optical beam direction is defined when the power transmission tower 200 or pole is not tilted or inclined and is close to the vertical position so that the cantilever 216 is aligned to the initial direction 219. The optical beam will undergo interference within the optical element between surface 214 (CA) and exit surface 220 so that a plurality of optical beams output from surface 220 will result in an intensity change as the angle of incidence of the optical beam 222 changes. The change in angle of incidence of the optical beam 222 will be similar to the change of angular position or displacement or rotation of the cantilever 216 from the initial position 219.

Figure 2:
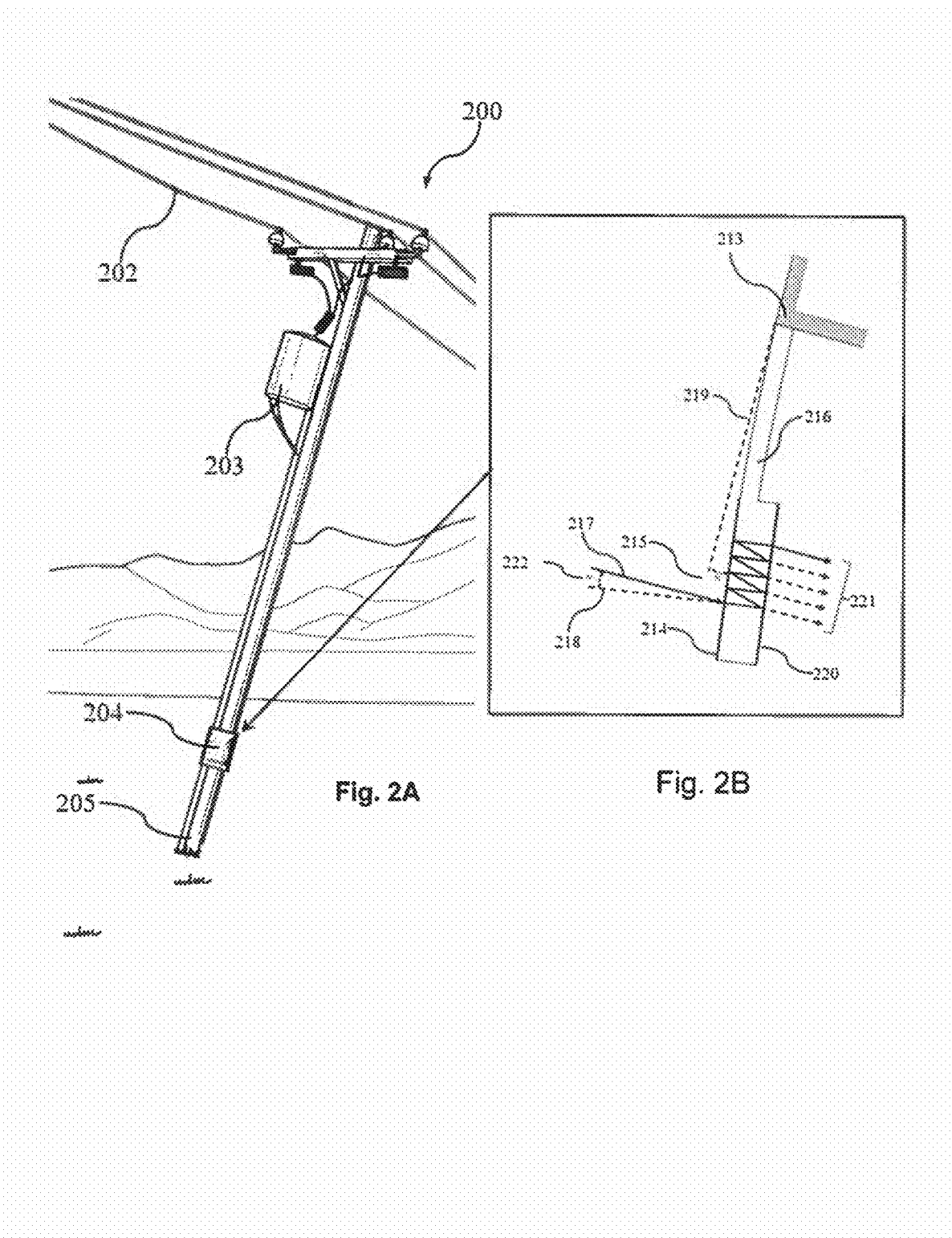
FIG. 2A is a perspective view of another environment including an exemplary power transmission tower monitoring system, with the power transmission tower in a tilt damage state.
FIG. 2B is a design view of a sensor having an optical element coupled to a cantilever for use in the exemplary power transmission monitoring system of the present invention while the power transmission tower is in the tilt damage state.
Figure 3:
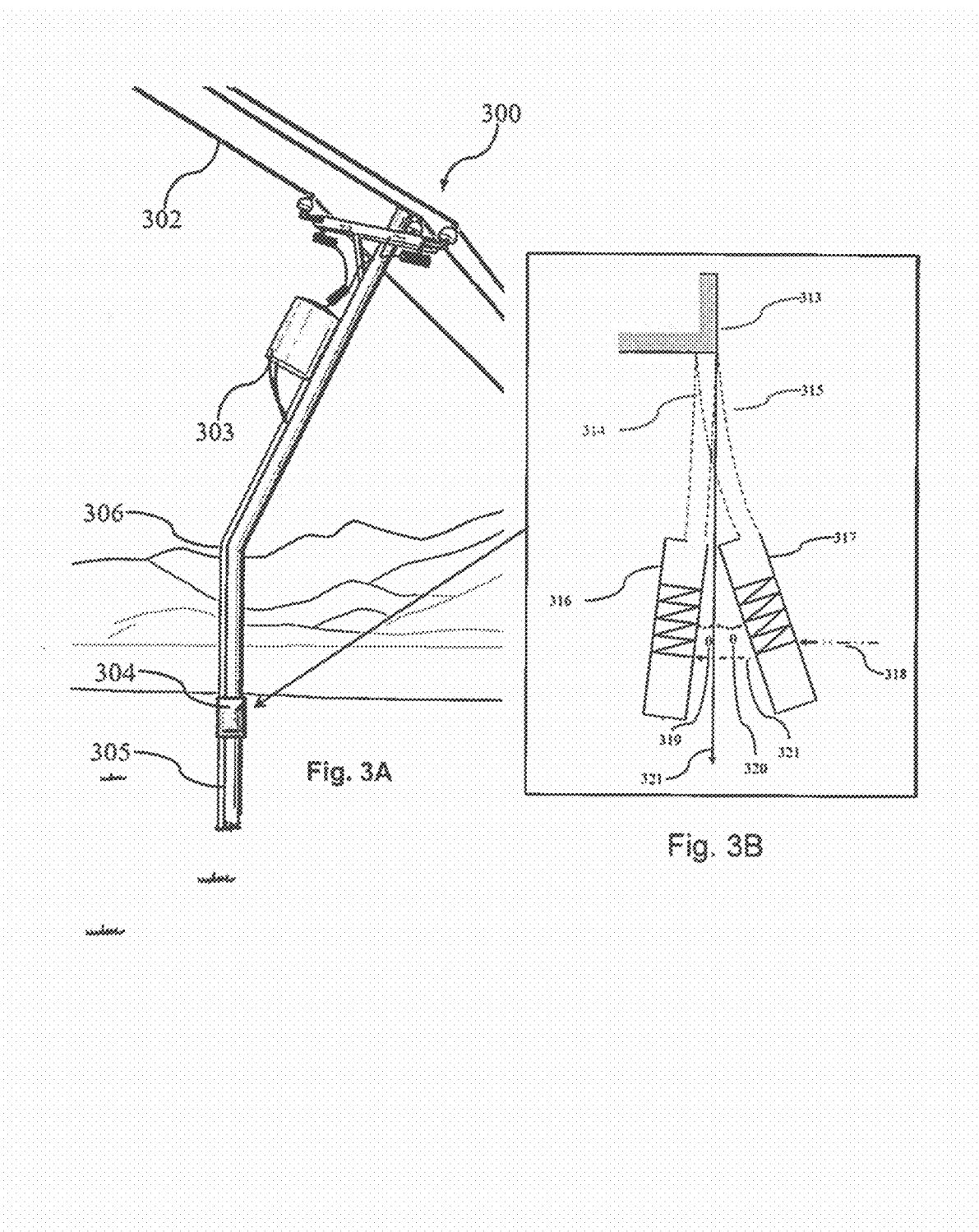
FIG. 3A is a perspective view of another environment including an exemplary power transmission tower monitoring system, with the power transmission tower in a shock damage state.
FIG. 3B is a design view of a sensor having an optical element coupled to a cantilever for use in the exemplary power transmission monitoring system of the present invention while the power transmission tower is in the shock damage state.

FIG. 3A is a perspective view of a power transmission tower 300 according to an embodiment of the present invention in a shock-fault operational state. As illustrated in FIG. 3A, the power transmission tower 300 is in a non-perpendicular orientation state from shock-fault point 306, however is in a perpendicular operational status at support base 305. The change of the power transmission tower operational states from FIG. 1A to FIG. 3A is the result of an environmental event or non-environmental event that results in a permanent non-perpendicular state at shock-fault point 306 in which power transmission tower 300 will not return to a perpendicular operational state as illustrated in FIG. 1A. The shock-fault point 306 may be located at any point along the power transmission tower from base 305 to power transmission lines 302.

Further, for the purpose of clarity, resulting damage to the voltage transformer 303, support structure 305 or voltage transmission cables 302 is not depicted. The power transmission tower 300 may or may not still be in an operational state that would result in the loss of power distribution. The monitoring system 304 is mounted at the base of 305 to alert to change of shock operational state of the said power transmission tower. More specifically, the present invention allows for the rapid identification of power transmission towers that may be operational for power distribution, however are in a non-perpendicular orientation along power transmission tower and pending a power distribution failure.

FIG. 3B illustrates the power transmission monitoring system 304 when the power transmission tower 200 is in the tilt-fault state shown in FIG. 2A. The cantilever 315 is attached to a base 313 at a cantilever pivot point and incorporates an optical element Clear Aperture (CA) 314 (entrance surface of optical beam). The shock-fault to the power transmission tower 300 causes cantilever 316 to vibrate between a first position and a second position as illustrated in FIG. 3B due to vibrations of the power transmission tower 300. The vibrations, or shock, acts to displace the cantilever 316 with optical element 314. The direction of the optical beam 317 incident on the optical element 314 will change with respect to the initial optical beam direction 318. The optical beam will undergo interference within the optical element between surface 314 (CA) and exit surface 320 so that a plurality of optical beams output from surface 320 will result in an intensity change as the angle of incidence of the optical beam 322 changes. The change in angle of incidence of the optical beam 322 will be similar to the change of angular position or displacement or rotation of the cantilever 316 from the first position to the second position.

Figure 4:
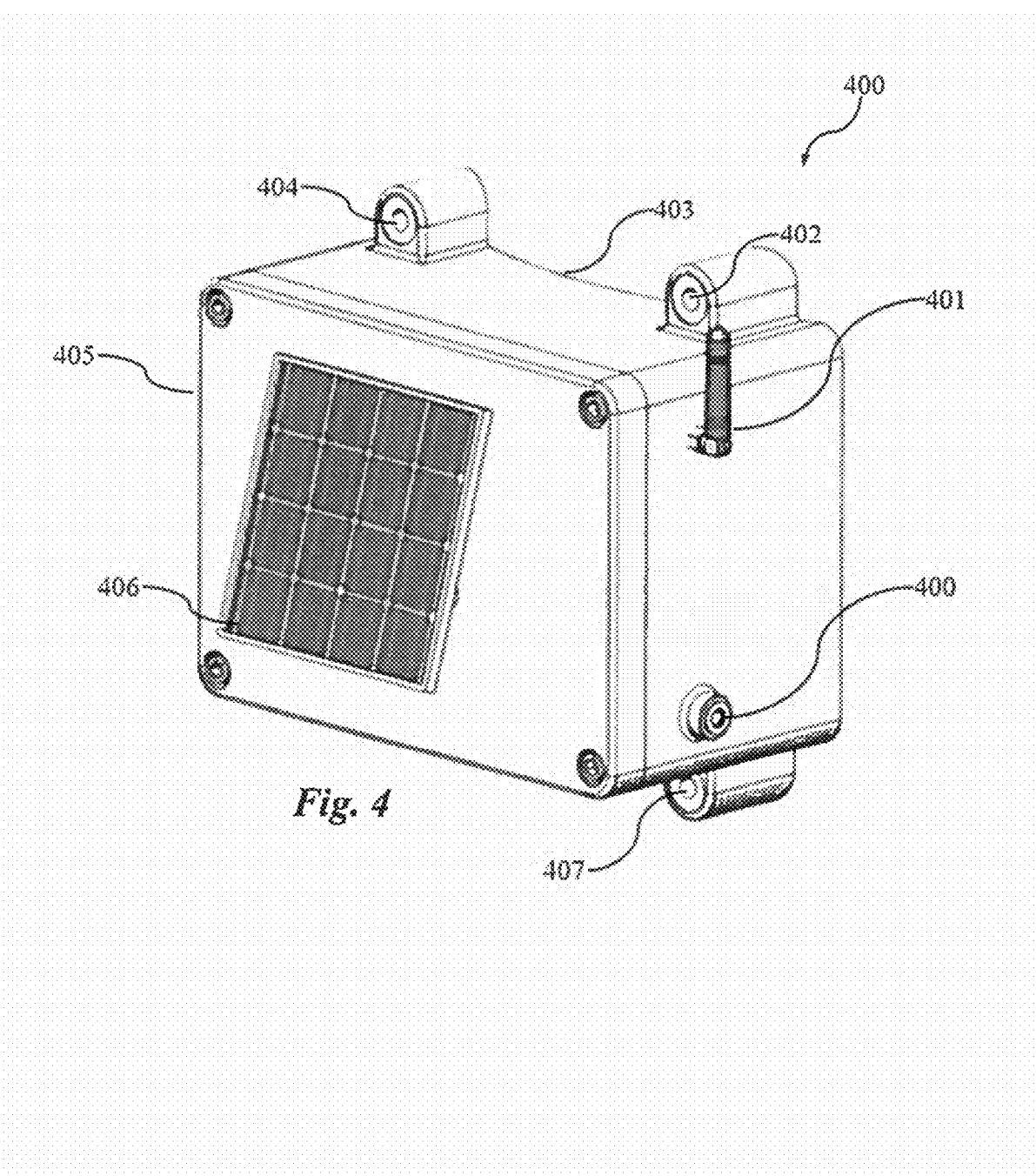
FIG. 4 is a perspective view of a power transmission tower condition monitoring system according to an embodiment of the present invention.

FIG. 4 is a perspective view of an exemplary condition monitoring system 400 that may be mounted to a power transmission tower in any of the operational states as illustrated in FIGS. 1A, 2A, and 3A. The exemplary embodiment, condition-monitoring system 400 includes a plurality of sensors, i.e., a vibrational sensor, an accelerometer, a shock sensor, and a temperature sensor (not shown). In the exemplary embodiment, the condition monitoring system 400 is mounted to the power transmission tower using screw grommets 404, 402, and 407 that are part of the enclosure 405. Enclosure 405 is designed to match the geometry of a typical power transmission tower shown in 403. This enables transmission of physical signals to the optical or electrical sensors located inside said enclosure 405. Enclosure 405 is designed to ensure operation in extreme environmental conditions. A solar power panel 406 is mounted to enclosure 405 to power, or supplement the power systems, of the condition monitoring system 400. Wireless data transmission antenna 401 is mounted to enclosure 405 for the transmission and receipt of data. An external power and data port 400 is also located on enclosure 405 for in field operation of the present invention.

In one example, the system is mounted on to the vertical mechanical mounting structure of the power transmission tower using a mechanical fastener system to allow for vibrational sensing. An exemplary embodiment senses the vibrations induced by external environmental effects and determines, based on frequency and magnitude, if the mechanical structure of the power transmission tower has been compromised or may fail at a later point. In another embodiment, sensors can be placed in the mechanical structure for the direct measurement of mechanical properties of the power transmission tower. A plurality of sensors and a plurality of measurement types can be embedded in the structure and systems of said power transmission tower such that they connect optically and or electrically to the detectors and processor.

System 400 may detect vibration, shock, temperature, and/or tilt of a power transmission tower, or monitor the condition of a power transmission tower, e.g., to determine changes in the standard frequency or a tilt or a shock event of the power transmission tower to identify potential failure states, or changes in environmental conditions surrounding the object, which may result in a pending fault.

Figure 5:
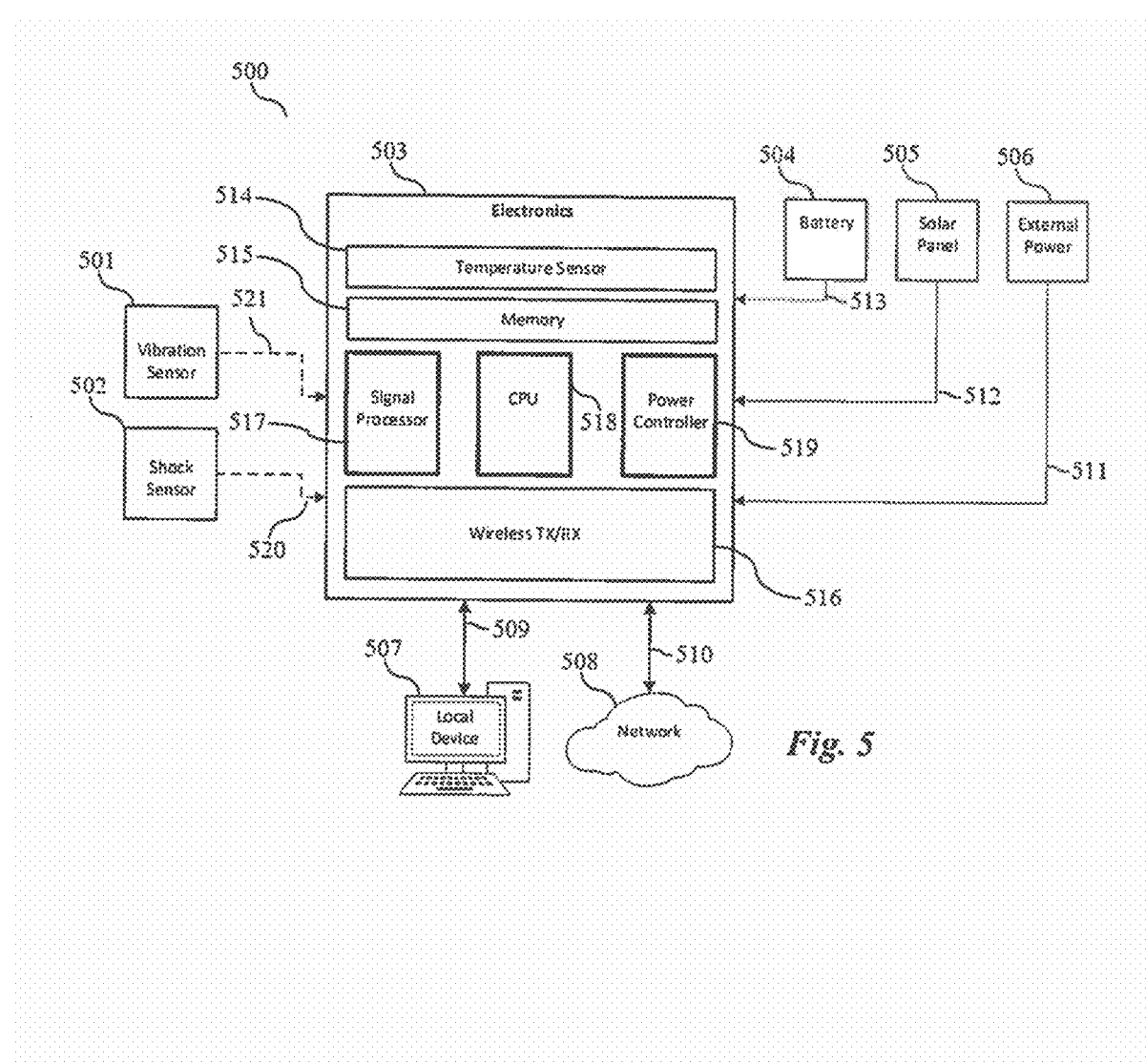
FIG. 5 is a schematic view of the exemplary condition monitoring system that may be used with the power transmission tower monitoring system shown in FIG. 4.

FIG. 5 is an operational schematic of an exemplary condition monitoring system 500. The present invention may use optical sensors, electrical sensors, or a combination of both optical and electrical sensors for the detection of current operational state of said power transmission tower.

For an optical sensor embodiment of the present invention, all of the active components of the system, such as the light source, detector, and any additional electronics, are enclosed in sensors 501, 502 that house separate optical components and electronics (not shown). Optical signal intensities are converted to an electrical signal and transmitted via electrical signal cables 521 and 520 that send a plurality of signal intensities to signal processor 517.

For an electrical sensor embodiment of the present invention all of the active components of the system, such as a MEMS sensor or a piezoelectric sensor, and any additional electronics, are enclosed in sensors 501 and 502 that house separate electronics (not shown). Electrical signals are transmitted via electrical signal cables 521 and 520 that send a plurality of signal intensities to signal processor 517.

In another embodiment, a combination of optical or electrical sensors may be used for vibration sensor 501, temperature sensor 514, and shock sensor 502 that send a plurality of signal intensities to signal processor 517.

Each of the sensors 501, 502, and 514 are located separately, allowing simultaneous measurement of different parameters of the current operational state of said power transmission tower. In this exemplary embodiment, the mechanical system, which may include voltage transformer 103, power transmission cables 102, and power transmission tower base 105 and power transmission tower 100 are being monitored.

In another embodiment, each of the sensors 501, 502, and 514 may further be located remotely from the active electronics of the light source and detector, which are located within device 400. In one embodiment, one or more sensors of the present invention may be embedded in the structure of the power transmission tower to measure for vibration or monitored with the active components (i.e., light source, detector, and other electronics)

System 500 includes control electronics 503 including a central processor unit (CPU) 518 and a memory 515 coupled to the processor 518 so that the central processor unit (CPU) 518 executes programmed instructions stored in memory 515 to determine, based on the measured signals values, a change in signal values that is proportional to the said sensor measurement of sensors 501, 502, and 514. Based on the signals of each sensor, the system 500 sends a control signal via wireless transmitter 516 or local connector port 400 via cable 509 to a local device 507 or to a control network 508 via wireless signal 510. Network 508 allows for external monitoring or control of the said power transmission tower condition monitoring system to change its current programmed instructions.

In one embodiment, system 500 includes a power controller 519 that monitors the power status of internal battery power source 504 via power connection 513. Power controller 519 determines, based on the current power levels of internal battery, whether power source 504 requires charging from solar panel 505 connected via power cable 512. Further, power controller 519 can determine if an external power source 506, connected via power cable 511, is available to charge battery 504 and power the said system 500.

Another exemplary aspect of the present invention uses a power management methodology and circuitry to power the unit using an internal battery, or a solar panel, or an external power source. The processor of the present invention determines, based on available data, which power source or combination of power sources to use to power the device. If the available power sources are unable to power the system, a super capacitor is used to power the circuits for wireless communication in order to inform external users of a pending system power failure.

Figure 6:
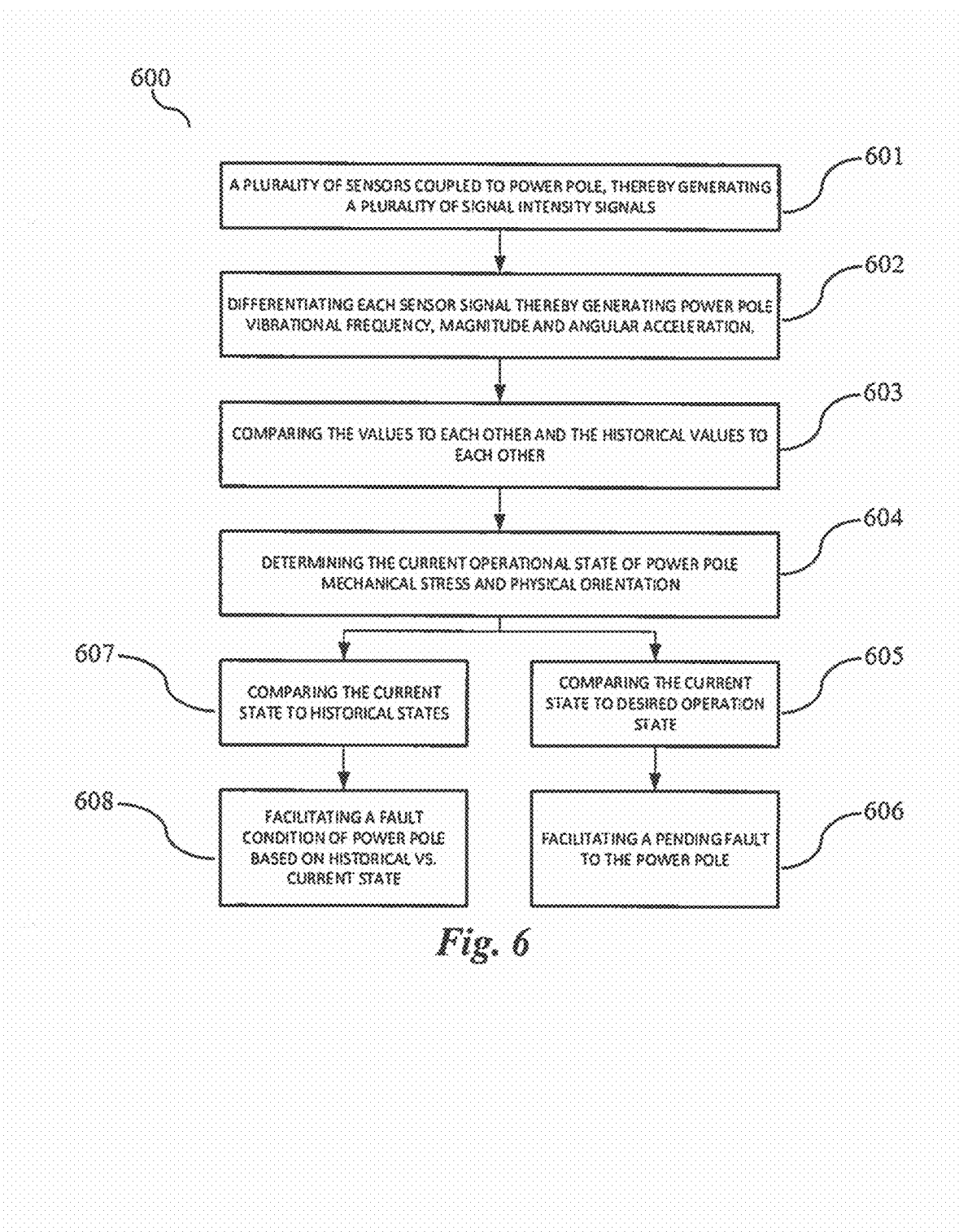
FIG. 6 is a flow chart of an exemplary method of operating the power transmission tower monitoring system shown in FIG. 4.

FIG. 6 is a flow chart of an exemplary method 600 of operating a power transmission tower 100 (shown in FIG. 1A). Method 600 includes at step 601 providing a plurality of sensors, such as sensors 501, 502, and 514, coupled to the power transmission tower 100, thereby generating plurality of optical or electrical intensity signals 601.

Figure 7:
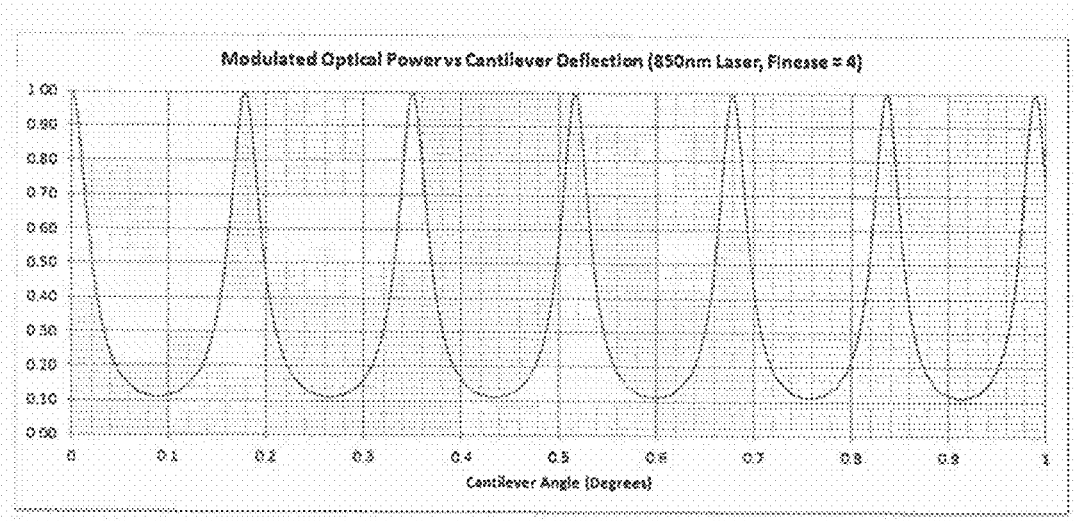
FIG. 7 is a plot of optical power measured by a static displacement optical tilt or incline sensor vs. end mass cantilever deflection angle ($\theta_C$) of the present invention.

FIG. 7 is a plot of the exemplary embodiment of the optical power measured by static displacement optical tilt or incline sensor vs. end mass cantilever deflection angle ($\theta_C$). The tilt angle $\theta_T$ varies linearly with respect to ($\theta_C$) from 5 to 40 degrees. In this example, the end mass is 2 grams, the cantilever length is 10 mm, width is 1 mm, thickness is 0.15 mm, and Young's modulus of cantilever is 69 GigaPascals (N/m$^2$), although other values may be utilized. Further in this example the laser wavelength utilized is 850 nm and finesse of the etalon=4, although other values may be utilized.

Method 600 also includes, as step 602, differentiating each sensor intensity signal, thereby generating a plurality of values, which may include, by way of example only, vibrational frequency, magnitude, angular acceleration, voltage, and current values. In step 603, the comparison of the current value state versus historic value state allows for the prediction of future current states. In step 604, a determination of the current operational state of the power transmission tower is made.

Comparing the status of the power transmission tower allows for simultaneously determination of the operational changes of the power transmission tower in steps 605 and 607 to facilitate determining a fault state in step 608 and to facilitate a pending fault state in step 606 of the power transmission tower.

The above condition monitoring system and method described herein facilitate operation of a power transmission tower by measuring the current operational state of said power transmission tower using multiple measurement types. Such conditional measurements provide indications of increased stress on the power transmission towers that may be reduced by changes in physical operational state of the power transmission tower, i.e. tilt, shock, vibration and operating temperature. Detection of and location of such stresses facilitates the expedient repair or replacement of power transmission towers to ensure increased reliability of power distribution systems.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A power transmission tower condition monitoring system comprising:
    a plurality of sensors positioned at a plurality of separate locations on a power transmission tower, wherein the plurality of sensors comprises at least one tilt sensor, at least one shock sensor, and at least one vibration sensor;
    one or more detectors configured to receive intensity value data from the plurality of sensors; and
    a computing device coupled to the one or more detectors, the computing device comprising a processor and a memory coupled to the processor, wherein the processor executes programmed instructions stored in the memory to:
        receive the intensity value data from the one or more detectors; and
        determine, based on the received intensity value data, a current operational health for the power transmission tower.

2. The system as set forth in claim 1, wherein the plurality of sensors comprise optical or opto-electronic sensors, or a combination thereof.

3. The system as set forth in claim 1, further comprising:
    a position locating device configured to be positioned on the power transmission tower and to provide position data for the power transmission tower.

4. The system as set forth in claim 3, where the position location device comprises a Global Positioning System (GPS) device or a Geographic Information System (GIS) device, or a combination thereof.

5. The system as set forth in claim 3, wherein the processor is further configured to execute additional programmed instructions stored in the memory to:
    receive position data for the power transmission tower for the position locating device; and
    transmit the position data to a remote monitoring station.

6. The system of claim 1, wherein the processor is further configured to execute at least one additional programmed instruction stored in the memory to determine, based on the measured intensity values for each of the plurality of sensors, an angular displacement value, a rotation value, a tilt value, and an incline value for the power transmission tower.

7. The system of claim 6, wherein the processor is further configured to execute at least one additional programmed instruction stored in the memory to determine an angular velocity value or an angular acceleration value for the power transmission structure based on the determined angular displacement value over time.

8. The system of claim 6, wherein the processor is further configured to execute at least one additional programmed instruction stored in the memory to determine a vibrational frequency based on the determined angular displacement value over time.

9. The system of claim 6, wherein the processor is further configured to execute additional programmed instructions stored in the memory to:
    compare each of the determined angular displacement value, rotation value, tilt value, and incline value for the power transmission tower to a plurality of corresponding historical displacement values, rotation values, tilt values, and incline values for the power transmission tower; and determine, based on the compared values, a potential failure state of the power transmission tower.

10. The system as set forth in claim 6, wherein the processor is further configured to execute additional programmed instructions stored in the memory to:

compare each of the determined angular displacement value, rotation value, tilt value, and incline value for the power transmission structure to corresponding standard operating angular displacement values, rotation values, tilt values, and incline values for the power transmission tower;

determine, based on the compared values, whether a difference between the determined values and the corresponding standard values exceeds a threshold value; and identify a potential failure state of the power transmission tower when the difference between the determined values and the corresponding standard values exceeds the threshold value.

11. A method for monitoring a condition of a power transmission tower, the method comprising:

providing the system of claim 1;

coupling the plurality of sensors to the power transmission tower at a plurality of separate locations on the power transmission tower;

measuring the intensity value data for the for each of the plurality of sensors over a period of time;

determining, based on the intensity value data for each of the plurality of optical sensors, a current operational health for the power transmission tower.

12. The method as set forth in claim 11, wherein the plurality of sensors comprise optical or opto-electronic sensors, or a combination thereof.

13. The method as set forth in claim 11, further comprising:

positioning a position locating device on the power transmission tower to provide position data for the power transmission tower.

14. The method as set forth in claim 13, wherein the position location device comprises a Global Positioning System (GPS) device or a Geographic Information System (GIS) device, or a combination thereof.

15. The method as set forth in claim 13 further comprising:

receiving position data for the power transmission tower for the position locating device; and transmitting the position data to a remote monitoring station.

16. The method of claim 11 further comprising determining, based on the measured intensity values for each of the plurality of sensors, an angular displacement value, a rotation value, a tilt value, and an incline value for the power transmission tower.

17. The method of claim 16 further comprising determining an angular velocity value or an angular acceleration value for the power transmission tower based on the determined angular displacement value over time.

18. The method of claim 16 further comprising determining a vibrational frequency based on the determined angular displacement value over time.

19. The method of claim 16 further comprising:

comparing each of the determined angular displacement value, rotation value, tilt value, and incline value for the power transmission tower to a plurality of corresponding historical displacement values, rotation values, tilt values, and incline values for the power transmission; and determining, based on the compared values, a potential failure state of the power transmission tower.

20. The method as set forth in claim 16 further comprising;

comparing each of the determined angular displacement value, rotation value, tilt value, and incline value for the power transmission tower to corresponding standard operating angular displacement values, rotation values, tilt values, and incline values for the power transmission tower;

determining, based on the compared values, whether a difference between the determined values and the corresponding standard values exceeds a threshold value; and identifying a potential failure state of the power transmission tower or pole when the difference between the determined values and the corresponding standard values exceeds the threshold value.

* * * * *